United States Patent [19]

Esaki et al.

[11] 4,371,884

[45] Feb. 1, 1983

[54] INAS-GASB TUNNEL DIODE

[75] Inventors: Leo Esaki, Chappaqua; Chin-An Chang, Peekskill, both of N.Y.

[73] Assignee: The United States of America as represented by the Secretary of the Army, Washington, D.C.

[21] Appl. No.: 227,890

[22] Filed: Jan. 23, 1981

[51] Int. Cl.³ .................................... H01L 29/88
[52] U.S. Cl. ................................. 357/12; 357/6; 357/16; 357/61
[58] Field of Search ............. 357/6, 12, 16, 61

[56] References Cited

U.S. PATENT DOCUMENTS 4,173,763 11/1979 Chang et al. ..................... 357/12
4,198,644 4/1980 Esaki et al. ..................... 357/12

OTHER PUBLICATIONS

C. A. Chang, et al., *Applied Physics Letters*, vol. 31, No. 11, Dec. 1977, pp. 759–761.
L. L Chang, et al., *J. Vac. Sci. Technol.*, vol. 10, No. 5, Sep./Oct. 1973, p. 655.

*Primary Examiner*—Martin H. Edlow
*Assistant Examiner*—J. L. Badgett
*Attorney, Agent, or Firm*—Nathan Edelberg; Sheldon Kanars; Jeremiah G. Murray

[57] ABSTRACT

Disclosed is a tunnel diode consisting of an accumulation region of p-type GaSb and an accumulation region of n-type InAs separated by a thin layer of a quaternary compound consisting of InGaSbAs. Such a diode structure converts the interface between the two accumulation regions of p-type and n-type material from what would normally be an ohmic junction into a tunneling junction. Such a tunnel diode requires no heavy doping which is normally required for a tunnel diode.

15 Claims, 5 Drawing Figures

U.S. Patent     Feb. 1, 1983     4,371,884
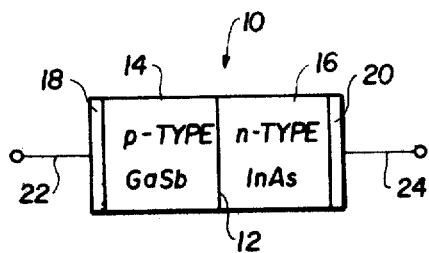
FIG.1
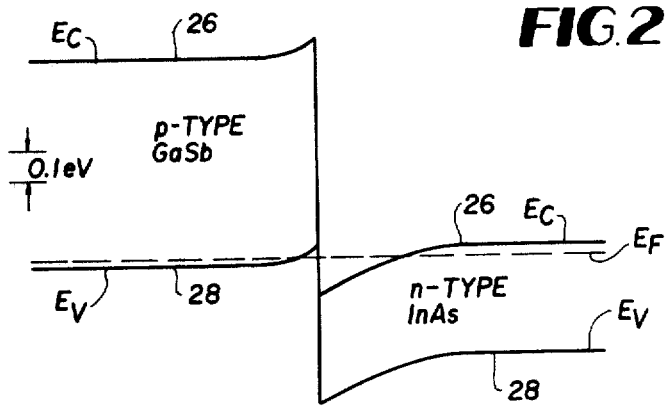
FIG.2
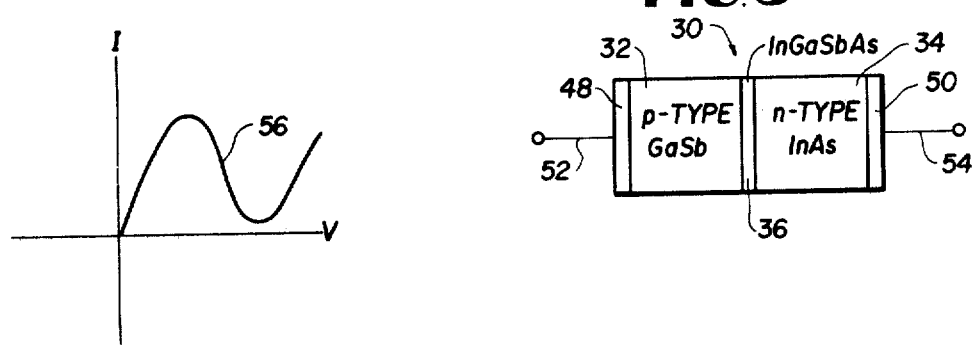
FIG.3
FIG.5
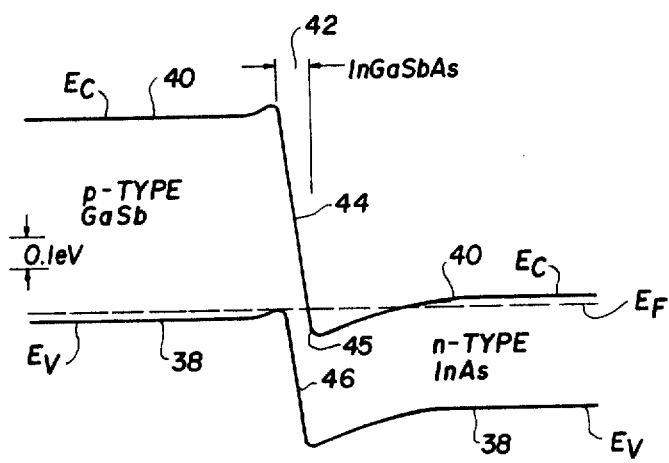
FIG.4 ns-GASB TUNNEL DIODE

The invention described herein may be manufactured and used by or for the Government for governmental purposes without the payment of any royalties thereon or therefor.

BACKGROUND OF THE INVENTION

This invention relates in general to semiconductor devices and more particularly to tunnel diode type of semiconductor devices.

The tunnel diode is now a well known semiconductor device and conventionally consists of two regions of heavily doped semiconductor material of opposite conductivity types separated by a relatively thin junction which permits charge carriers to tunnel therethrough upon the application of a suitable operating potential to the semiconductor regions. More recently, a new tunnel diode has emerged in the form of a heterostructure and is typified in U.S. Pat. No. 4,198,644 entitled, "Tunnel Diode" issued to Leo Esaki on Apr. 15, 1980. The tunnel diode described in the Esaki patent is comprised of a heterostructure consisting of adjoining regions of $GaSb_{1-y}As_y$ and $In_{1-x}Ga_xAs$ interfaced with a tunneling junction. This device, moreover, was noted to be fabricated by the process of molecular beam epitaxy which is a system adapted to provide ultra-thin, well defined multilayer heterostructures of high quality in a controlled manner. As such, atomically smooth surfaces and extremely sharp boundaries at the interface of two closely lattice matched semiconductors can be produced with a minimum number of defects. References describing the technique of molecular beam epitaxy (MBE) include the publications entitled:

"Structures Grown By Molecular Beam Epitaxy", L. L. Chang, et al., *J. Vac. Sci. Technol.*, Vol. 10, No. 5, September/October, 1973, p. 655:

"Semiconductor Superfine Structures By Computer-Controlled Molecular Beam Epitaxy", L. Esaki, et al., *Thin Solid Films*, 36 (1976), pp. 285–298; and "Molecular Beam Epitaxy (MBE) of $In_{1-x}Ga_xAs$ and $GaSb_{1-y}As_y$", C. A. Chang, et al., *Applied Physics Letters*, Vol. 31, No. 11, Dec. 1977, pp. 759–761.

While the tunnel diode disclosed in the above mentioned Esaki patent is designed to operate with relatively lower doping levels than conventional tunnel diodes currently utilized, the present invention is directed to still a further improvement in such devices.

It is an object of the present invention, therefore, to provide a new and useful improvement in tunnel diodes requiring no heavy doping and which can be readily fabricated by the process of molecular beam epitaxy.

SUMMARY

Briefly, the foregoing and other objects of the present invention are accomplished by means of a tunnel diode heterostructure comprising first and second accumulation regions of relatively lightly doped group III-V compounds specifically consisting of $In_{1-x}Ga_xAs$ and $GaSb_{1-y}As_y$ where the concentrations expressed in terms of x and y is preferably zero, but less than 0.3 whereby substantially pure InAs and GaSb regions are provided and where the improvement consists in the mechanism of an interface of a relatively thin layer of a quarternary compound whose constituent materials are those of the adjoining accumulation regions i.e. $In_{1-x}Ga_xSb_{1-y}As_y$ whose concentrations are preferably substantially equal. Such an interface provides a tunneling junction as opposed to an ohmic junction between contiguous regions of InAs and GsSb.

BRIEF DESCRIPTION OF THE DRAWINGS

FIG. 1 is a schematic diagram illustrative of an InAs-GaSb diode having an ohmic junction therebetween;

FIG. 2 is an energy band diagram of the device shown in FIG. 1;

FIG. 3 is a schematic diagram of an InAs-GaSb tunnel diode embodying the subject invention in its preferred form;

FIG. 4 is a diagram illustrative of the energy band characteristic of the embodiment of the subject invention shown in FIG. 3; and FIG. 5 is a current-voltage characteristic diagram typically exhibited by the tunnel diode of the subject invention.

DESCRIPTION OF THE PREFERRED EMBODIMENT

Referring now to the drawings and more particularly to FIG. 1, reference numeral 10 designates a semiconductor diode having an ohmic junction 12 formed at the interface between a region or layer 14 of p-type gallium antimonide (GaSb) and a region or layer 16 of n-type indium arsenide (InAs). Reference numerals 18 and 20 designate ohmic contact surfaces formed on the outer surfaces of the regions 14 and 16, respectively, for the application of a DC power supply potential, not shown, which is adapted to be connected thereto via the circuit leads 22 and 24. Where the interface 12 is atomically smooth and abrupt as can be achieved by means of molecular beam epitaxy (MBE), an energy band diagram as shown in FIG. 2 results. Where the GaSb region 14 is doped with p-type impurities, holes are in abundance in the energy gap between the conduction band $E_c$ and the valance band $E_v$ whereas if the InAs region 16 is doped with n-type impurities, there exists an abundance of electrons in the energy gap. As is well known for proper operation the band gaps of the two semiconductor regions 14 and 16 must be shifted in opposite directions with respect to the Fermi level $E_f$ and overlap so that either the conduction band edge 26 or the valance band edge 28 of one semiconductor region lies in the energy band gap of the other semiconductor region. In the structure of FIG. 1, the conduction band edge 26 of the InAs region 16 lies within the energy band gap of the GaSb region 14, while the valance band edge 28 of the GaSb region 41 lies within the band gap of the InAs region 16. This requirement is well known to those skilled in the art and is discussed, for example, in U.S. Pat. No. 4,173,763 entitled, "Heterojunction Tunneling Base Transistor", issued to L. L. Chang, et al. on Nov. 6, 1979. This principle is also set forth in the text entitled, *Heterojunctions and Metal-Semiconductor Junctions*, by Milnes, et al., Academic Press, New York, 1972, pp. 1–93. What is significant about the structure shown in FIG. 1 is that at the interface 12 the accumulated electrons in the InAs region or layer 16 combine with the accumulated holes in the GaSb region or layer 14 and an ohmic behavior is exhibited.

Turning attention now to the subject invention which is disclosed in FIGS. 3 and 4, reference numeral 30 designates a diode structure similar to that shown in FIG. 1 in that it also includes p and n-type regions 32 and 34 consisting of GaSb and InAs; however, the ohmic interface 12 shown in FIG. 1 is replaced by a thin layer or spatial separation region 36 of a quarternary compound whose constituents comprise the constituents of semiconductor regions on either side thereof. Accordingly, where the region 32 is comprised of p-type $GaSb_{1-y}As_y$ and region 34 is comprised of n-type $In_{1-x}Ga_xAs$, where x and y is preferably zero but less than 0.3, layer 36 is comprised of $In_{1-x}Ga_xSb_{1-y}As_y$. Where the regions 32 and 34 are comprised of pure GaSb and InAs, the layer 36 is preferably equal concentrations of In, Ga, Sb, and As. What is formed thereby is a tunneling junction whose tunneling characteristic is determined by the width of the separation layer 36. Typically this width dimension is in the order of 100 Å.

This thin layer 36 of $In_{1-x}Ga_xSb_{1-y}As_y$ can be fabricated between the semiconductor regions 32 and 34 by means of a well known controlled high temperature diffusion process starting from an MBE grown InAs-GaSb abrupt junction 12 as shown in FIG. 1 or the quarternary compound comprising the thin layers 36 can be grown simply by an MBE process wherein the effusion cells containing the sources of In, Ga, Sb and As are selectively controlled in a well known manner to provide the proper concentrations. When desirable, a combination of these two processes may be employed.

Because the MBE process permits relatively precise control over the thickness of the layer 36, an increase in flexibility in optimizing the transport properties desired in a tunnel diode can be achieved. Additionally, what is significant about the tunnel diode structure shown in FIG. 3 is that it requires no heavy doping which is normally needed for conventional tunnel diodes. The proposed tunneling transport will take place even for relatively undoped samples of constituent materials having carrier concentrations in the order of $5 \times 10^{16}$ cm.$^{-3}$.

The energy band diagram for the tunnel diode as shown in FIG. 3 is illustrated in FIG. 4 and resembles the energy band diagram of FIG. 2 insofar as the relative positions of the band gaps for the p-type GaSb and n-type InAs regions is concerned. As shown in FIG. 4, the respective band gaps overlap with the valance band edge 38 of the GaSb region being below the Fermi level $E_f$ while conduction band edge $E_c$ 40 of the InAs region is above the Fermi level as in the case of the diode having an ohmic junction as evidenced by FIG. 2; however, the abrupt discontinuity of the conduction band edges 26 and the valance band edges 28 are replaced by a tunneling band gap region 42 whose width is determined by the width of the InGaSbAs layer 36 shown in FIG. 3. Moreover, the transition, as evidenced by the conduction band segment 44 and the valance band segment 46, is substantially uniform and relatively gradual.

Also the energy bands have a negative overlap at the tunneling band gap region 42 of the interface formed by the InGaSbAs layer 36. As shown in FIG. 4, the conduction band edge 40 of the n-type InAs region 34 lies below the valance band edge 38 of the p-type GaSb region 32 at the conduction band edge portion 45.

Accordingly, when a forward bias is impressed across the contact layers 48 and 50 of the semiconductor structure shown in FIG. 3, by means of the leads 52 and 54, a tunneling behavior will occur resulting in providing a negative resistance as exhibited by the curve portion 56 of the current-voltage characteristic curve shown in FIG. 5 which is a curve typically illustrative of the operating characteristics of a tunnel diode.

While the subject invention has been described with a certain degree of particularity the foregoing has been made by way of illustration and not of limitation. Accordingly, all modifications, alterations and changes coming within the spirit and scope of the invention as set forth in the appended claims are herein meant to be incorporated.

We claim:

1. A high speed semiconductor device exhibiting a tunneling characteristic, comprising in combination:

first and second semiconductor regions having a mutually different composition and conductivity type separated by a relatively thin interface layer having a composition including the constituent materials of both said first and second semiconductor regions, said first and second semiconductor regions having energy band gaps which are shifted in mutually opposite directions and where said interface layer is sufficiently thin that the mechanism for carrier transfer between said first and second semiconductor regions is tunneling through said interface layer.

2. The semiconductor device as defined by claim 1 wherein the valance band edge of one of said first and second semiconductor regions lies below the Fermi level substantially to the same extent that the conduction band edge of the other of said first and second semiconductor regions lies above the Fermi level.

3. The semiconductor device as defined by claim 2 wherein said first and second semiconductor regions have energy band gaps which have a negative overlap in the region of said interface layer wherein the conduction band edge edge of one of said semiconductor regions lies below the valance band edge of the other of said semiconductor regions.

4. The semiconductor device as defined by claim 3 wherein said one semiconductor region is comprised of n-type semiconductor material and said other semiconductor region is comprised of p-type semiconductor material.

5. The semiconductor device as defined by claim 3 wherein said one semiconductor region is comprised of n-type InAs, said other semiconductor region is comprised of p-type GaSb and said interface layer is comprised of InGaSbAs.

6. The semiconductor device as defined by claim 1 wherein said first and second semiconductor regions are comprised of group III-V semiconductor materials.

7. The semiconductor device as defined by claim 1 wherein said first semiconductor region is comprised of $In_{1-x}Ga_xAs$, said second region is comprised of $GaSb_{1-y}As_y$ and said interface layer is comprised of $In_{1-x}Ga_xSb_{1-y}As_y$.

8. The semiconductor device as defined by claim 1 wherein said first semiconductor region is comprised of $In_{1-x}Ga_xAs$ and said second region is comprised of $GaSb_{1-y}As_y$, where the values of x and y is preferably 0 but less than 0.3.

9. The semiconductor device as defined by claim 8 wherein said interface layer is comprised of a quarternary compound including the materials In, Ga, Sb, and As.

10. The semiconductor device as defined by claim 8 wherein said first and second semiconductor regions are comprised of InAs and GaSb and said interface layer is comprised of InGaSbAs.

11. The semiconductor device as defined by claim 8 wherein the doping concentration of said first and second regions can be as small as $5 \times 10^{16}$ cm.$^{-3}$.

12. The semiconductor device as defined by claim 1 wherein said first and second semiconductor regions are comprised of substantially pure InAs and GaSb, respectively, and wherein said interface layer comprises a quarternary compound including the constituent materials In, Ga, Sb and As in predetermined concentrations.

13. The semiconductor device as defined by claim 12 wherein the quarternary compound is comprised of substantially equal concentrations of In, Ga, Sb and As.

14. The semiconductor device as defined by claim 13 wherein the concentration of the thin interface constituent materials forms a substantially uniform transition between the respective conduction bands and the respective valance bands of said first and second semiconductor regions and wherein the conduction band edge of one of said semiconductor regions lies below the valance band edge of the other of said semiconductor regions in the region of said interface layer.

15. The semiconductor device as defined by claim 14 wherein said one semiconductor region is comprised of n-type InAs and said other semiconductor region is comprised of p-type GaSb.

* * * * *